United States Patent [19]
Gariazzo

[11] 3,988,670
[45] Oct. 26, 1976

[54] AUTOMATIC TESTING OF DIGITAL LOGIC SYSTEMS

[75] Inventor: Michael C. Gariazzo, Bowie, Md.

[73] Assignee: The United States of America as represented by the Secretary of the Navy, Washington, D.C.

[22] Filed: Apr. 15, 1975

[21] Appl. No.: 568,234

[52] U.S. Cl. .......................... 324/73 AT; 324/73 R; 235/153 AC; 235/153 AP
[51] Int. Cl.² .................. G01R 15/12; G06F 15/20
[58] Field of Search .................... 324/73 R, 73 AT; 235/153 AC, 153 AP

[56] References Cited
UNITED STATES PATENTS

| | | | |
|---|---|---|---|
| 3,581,074 | 5/1971 | Waltz | 235/153 |
| 3,597,682 | 8/1971 | Hubbs et al. | 324/73 AT |
| 3,784,907 | 1/1974 | Eichelberger | 324/57 DE |
| 3,784,910 | 1/1974 | Sylvan | 324/73 AT |
| 3,873,818 | 3/1975 | Barnard | 235/153 AC |
| 3,892,954 | 7/1975 | Neuner | 235/153 AC |
| 3,892,955 | 7/1975 | Maejima | 235/153 AC |

Primary Examiner—Palmer C. Demeo
Assistant Examiner—Vincent J. Sunderdick
Attorney, Agent, or Firm—R. Sciascia; R. Beers; S. Sheinbein

[57] ABSTRACT

Automatic testing of digital sequential logical devices employing a read only memory programmed with a series of inputs. The read only memory programmed outputs are then compared in EXCLUSIVE OR gates with the outputs of the device under test.

4 Claims, 15 Drawing Figures

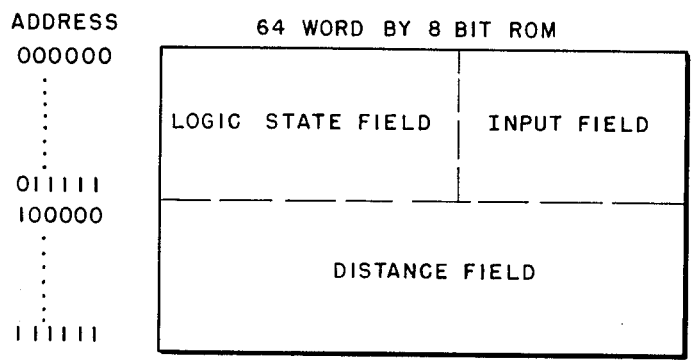
FIG. 1
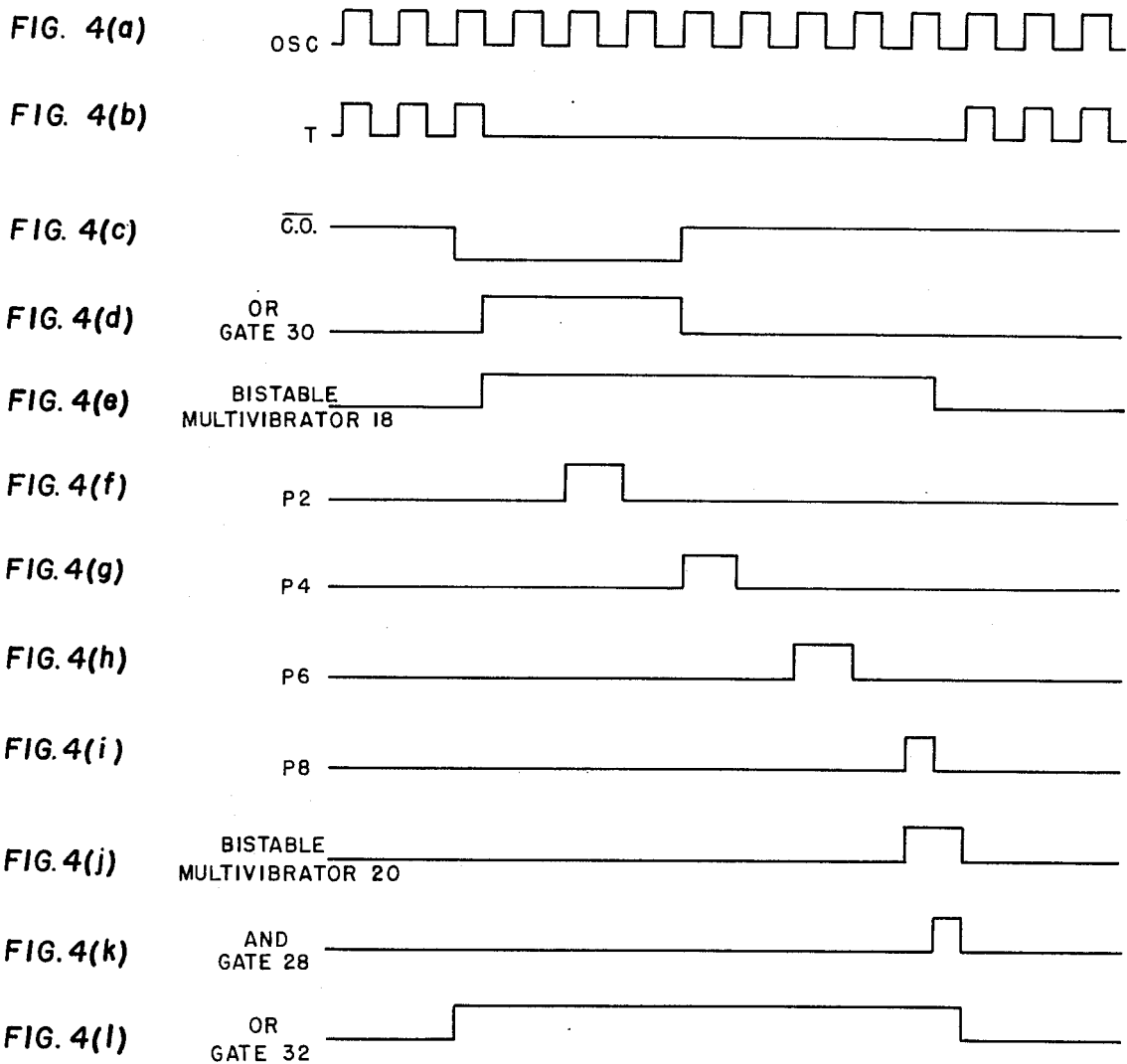

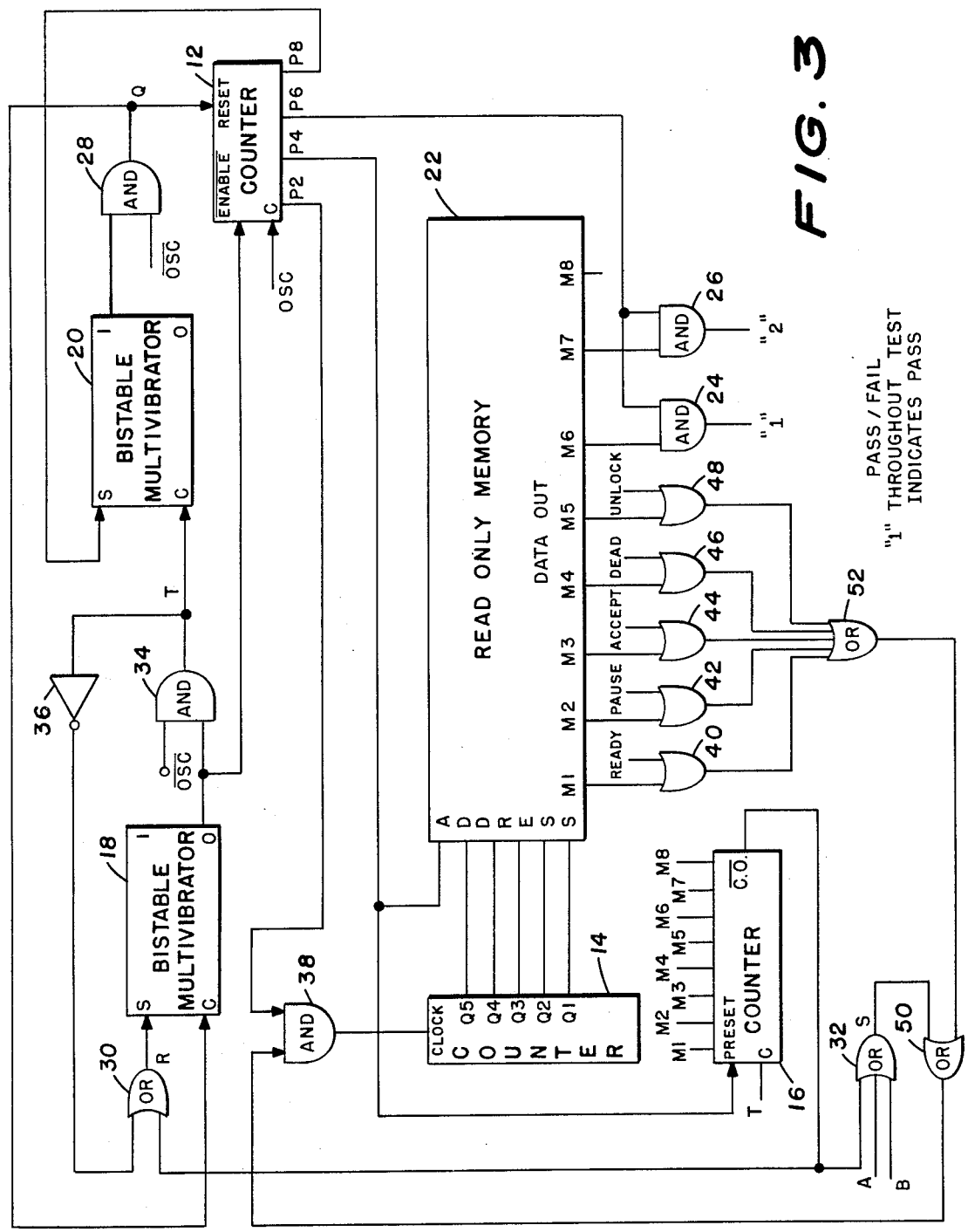

AUTOMATIC TESTING OF DIGITAL LOGIC SYSTEMS

BACKGROUND OF THE INVENTION

A vast number of complex digital systems are sequential in nature, i.e., the next state of the system depends not only on the applied inputs, but upon the past history of events as well. A familiar and simple example of such a device is a digital clock, in which each time pulse advances the system to a new and different state until a predetermined counting modulus has been exceeded. More complex representatives in this class include increasing amounts of electronic ordnance, among which are underwater mines and sophisticated fuzes.

SUMMARY OF THE INVENTION

Accordingly, there is provided a low cost, high speed automatic tester of digital sequential logical devices. Logic elements are coupled to cause a preprogrammed Read Only Memory to go through its stages to compare its output with those outputs of the device under test in EXCLUSIVE OR gates whereby any failures in the devices could be easily detected.

OBJECTS OF THE INVENTION

It is therefore an object of the present invention to provide automatic testing of sequential digital logic systems.

Another object of the present invention is to provide a high speed, low power automatic test of digital logic devices.

Yet another object of the present invention is to provide a universal sequential digital logic system tester.

Still another object of the present invention is to provide extensive automatic testing of a variety of digital devices.

Other objects, advantages and novel features of the invention will become apparent from the following detailed description of the invention when considered in conjunction with the accompanying drawings wherein:

FIG. 1 is the data storage format of the read only memory according to this invention;

FIG. 3 illustrates in block diagram form the apparatus for automatically testing digital information according to this invention; and FIGS. 4(a)-4(b) are timing diagrams at various points in the circuit of FIG. 3.

DESCRIPTION OF THE PREFERRED EMBODIMENT

Figure 2:
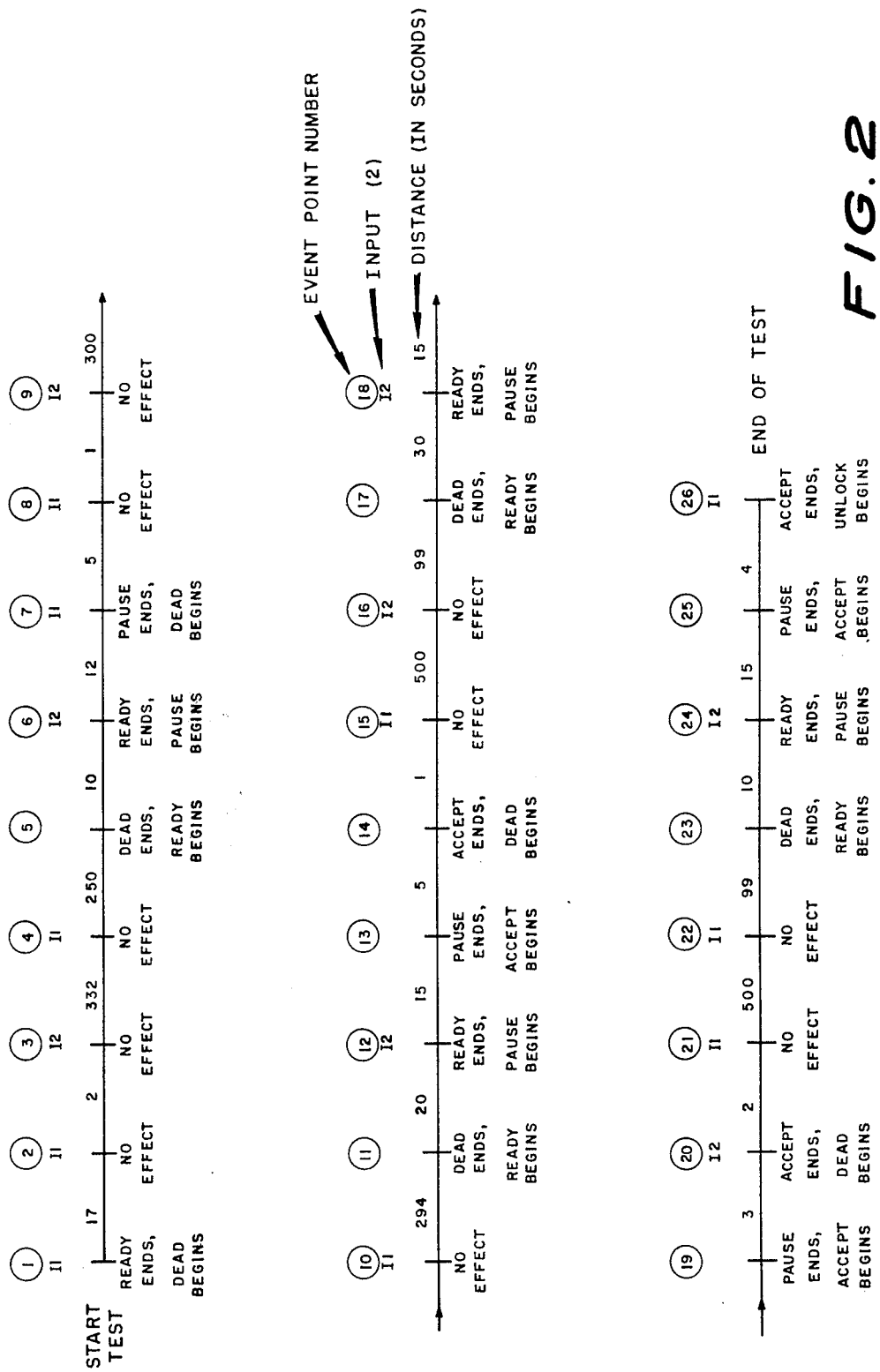
FIG. 2 is the automatic test sequence according to this invention.

The automatic tester can be applied to the following model: M different inputs can be applied, singly or in combination, at any times $t_{M1}, t_{M2}, \ldots t_{MQ}$ relative to the beginning of the test. In response to these inputs, one or more the the N system state variables may change at time $t_{N1}, t_{N2}, \ldots t_{NR}$. All times $t_{Mi}, t_{Nj}$ must be synchronous with the system clock, which is an input to the tester. The number of different inputs (M), the number of times one or more inputs are applied (Q), the quantity of outputs to be monitored (N), the number of output changes (R) and the total duration of the test in time are all unlimited, in theory, and do not directly influence system complexity.

The heart of the tester is a read-only memory (hereinafter ROM) programmed with a series of inputs and the expected outputs thus stimulated, all as a function of time. Since there is an infinite ordering of inputs in any multi-input system, all possible orders cannot be tested, but a carefully designed sequence can force the unit under test to exercise very different response of which it is capable.

The memory storing a test sequence is organized in a series of data nodes, each of which contains the information associated with an "Event Point." An Event Point is defined as any time or one or more inputs are applied, one or more system outputs change, or both. The data node corresponding to an Event Point consists of three fields: a logic state field, which contains the new expected output state; an input field, which designates the inputs to be applied at that Event Point: and a "distance" field, which defines the time duration to the next Event Point. FIG. 1 illustrates one possible data node format for which two words per node are required, one word devoted to the distance field, while the other word is divided into input and logic state fields.

The structuring of the data nodes is ordained by the characteristics of the test. If there are few inputs but many outputs, the logic state field would be made much larger than the input field. Similarly, the length of the distance field is determined by the size of the intervals between Event Points in a test.

To illustrate a sample test sequence, consider a hypothetical digital combination lock with the following properties. To unlock the device, a number (input combination) is first keyed in while the device is "Ready." This stimulus causes the lock to enter a 15-second "Pause" mode, during which time no entries are to be made. When the Pause mode ends, and "Accept" time, lasting 5 seconds, commences. A correct second keyed number causes the lock to open. However, if an incorrect number is keyed, or if any number is keyed during the Pause mode, or if the Accept time is allowed to expire, a 10-minute "Dead" time begins, during which no entries are accepted.

An automatic test sequence consisting of a series of Event Points has been tailored to this lock, and is given in FIG. 2. It has been assumed for simplicity that only two different inputs are possible: 1 or 2. There are five output states: Ready, Pause, Accept, Dead, and Unlock. The lock has been preset to the combination 2,1.

A number of noteworthy points are elucidated by FIG. 2. Most important, every operational mode of the device being tested is exercised. First, an incorrect initial entry is made, starting a Dead Time. The validity of that deadness is checked, and the Dead time expiration is verified. The next attempt begins with a correct keying of the first number, followed by an entry during the Pause time. A Dead Time again ensues. The third series is started by a correct first number, but the Accept time is allowed to pass, thereby starting the Dead Time. Next, the correct first entry is made, but an incorrect second number is keyed during the Accept time, resulting in a Dead Time. Finally, the proper first number is followed by a correct second entry, and the device unlocks.

More than 42 minutes of real time elapse during this test sequence, but by speeding the 1-Hz system clock to 10 kHz the operation would consume just 3/10-second.

The nature of Event Points is well illustrated by FIG. 2. Event Point 1, for example, denotes both an input and a state change. Event Point 2, however, has an input but no state change. Finally, Event Point 5 contains no input, but represents a change in output states. Every Event Point corresponds to a data node, and each of these nodes has a distance field storing the time to the next Event Point. In FIG. 2, the distance field is as short as one second for Node 2, and as long as 500 seconds for Node 15.

A test sequence such as that of FIG. 2 may readily be stored in a read-only memory, but an operating system is required to page the memory and coordinate the test. The system devised for this purpose is shown in FIG. 3.

A high-speed oscillator designated OSC provides a clock for the test system. To begin a test, Counters 14, and 16 are cleared to 0, bistable multivibrator 18 is set, and bistable multivibrator 20 is cleared. Setting bistable multivibrator 18 enables Counter 12 to be clocked by OSC, producing in turn its eight decoded outputs: P1, P2, . . . P8.

On P2, Counter 14, the Event Point Counter, is increased by one, by input from AND gate 38, in this case to a counter state of 1. This count addresses the first data node of the Read Only Memory (ROM) 22. Assuming an eight-bit memory word length and the node structure of FIG. 1, P4 selects the distance field of the data node (by introducing at "1" at the 6th address bit). Simultaneously, this distance, the number of pulses required to reach the next Event Point, is preset into Counter 16. When P4 ends, the first word of the data node (containing the logic state and input fields) is again addressed. P6 enables gates 24 and 26 to transmit inputs "1" or "2" if the data node so indicates.

Bistable multivibrator 20 is set by P8, and AND gate 28, having as its inputs $\overline{OSC}$ and bistable multivibrator 20, is used to clear both bistable multivibrator 18 and Counter 12. This resetting of bistable multivibrator 18 enables OSC to produce pulse chain T by AND gate 34, which is applied to clear bistable multivibrator 20, clock Counter 16 and provide the timing pulses to the unit (not shown) under test. FIG. 4(a)-4(l) is a timing diagram showing the relationship among these signals.

When Counter 16 reaches a count of 0 (by counting down), a carry-out signal ($\overline{C.O.}$) (FIG. 4(c)) is generated. The correct number of pulses having been provided to the unit under test, the second Event Point has been reached. OR gate 30 having as its input $\overline{C.O.}$ and T (from inverter 36) is then used to set bistable multivibrator 18, and the sequence described above is repeated to stimulate the second Event Point. The test continues in this matter until completion.

In order to determine whether a unit has passed or failed, the logic state of the unit under test is compared in EXCLUSIVE-OR gates 40, 42, 44, 46, and 48 with the expected logic states supplied by the Read Only Memory 22. The two outputs should correspond identically except during the interval when the operating system is being updated and the pulse chain T is inhibited. The EXCLUSIVE OR gates are coupled to supply a PASS/FAIL signal. To prevent an incorrect failure indication during that interval, a failure-inhibit signal from OR gate 32, having as its input the output signals from bistable multivibrator 18 and 20 and $\overline{C.O.}$, is generated and used to inhibit a failure indication.

If a failure occurs, the PASS/FAIL signal from OR gate 50 can be used to inhibit the clocking of the Event Point Counter 14 by gate 38. The Event Point at which the failure occurs can then be displayed, yielding helpful diagnostic information concerning the nature of the mishap.

Returning to the example of the digital combination lock, a 64-word 8-bit ROM is sufficient to store the test sequence of FIG. 2. A minor complication arises because an 8-bit distance field can store no distance greater that 255. To overcome this difficulty, auxiliary Event Points, containing neither inputs nor state changes, are inserted between distant Event Points so that no distance exceeds 255 pulses. Table I shows the contents of the ROM programmed for the test of FIG. 2.

TABLE I

| Event Point | Node | Memory Address | Lower Memory Contents | | | | | Input Field | | Upper Memory Contents | |
|---|---|---|---|---|---|---|---|---|---|---|---|
| | | | Logic State Field | | | | | | | | |
| | | | M1 (Ready) | M2 (Pause) | M3 (Accept) | M4 (Dead) | M5 (Unlock) | M6 (Input 1) | M7 (Input 2) | Memory Address | Distance Field M1-M8 |
| 0 | 0 | 0 | 1 | 0 | 0 | 0 | 0 | 0 | 0 | 32 | 0 |
| 1 | 1 | 1 | 0 | 0 | 0 | 1 | 0 | 1 | 0 | 33 | 17 |
| 2 | 2 | 2 | 0 | 0 | 0 | 1 | 0 | 1 | 0 | 34 | 1 |
| 3 | 3 | 3 | 0 | 0 | 0 | 1 | 0 | 0 | 1 | 35 | 255 |
| 3A | 4 | 4 | 0 | 0 | 0 | 1 | 0 | 0 | 0 | 36 | 77 |
| 4 | 5 | 5 | 0 | 0 | 0 | 1 | 0 | 1 | 0 | 37 | 250 |
| 5 | 6 | 6 | 1 | 0 | 0 | 0 | 0 | 0 | 0 | 38 | 10 |
| 6 | 7 | 7 | 0 | 1 | 0 | 0 | 0 | 0 | 1 | 39 | 12 |
| 7 | 8 | 8 | 0 | 0 | 0 | 1 | 0 | 1 | 0 | 40 | 5 |
| 8 | 9 | 9 | 0 | 0 | 0 | 1 | 0 | 1 | 0 | 41 | 1 |
| 9 | 10 | 10 | 0 | 0 | 0 | 1 | 0 | 0 | 1 | 42 | 255 |
| 9A | 11 | 11 | 0 | 0 | 0 | 1 | 0 | 0 | 0 | 43 | 45 |
| 10 | 12 | 12 | 0 | 0 | 0 | 1 | 0 | 1 | 0 | 44 | 255 |
| 10A | 13 | 13 | 0 | 0 | 0 | 1 | 0 | 0 | 0 | 45 | 39 |
| 11 | 14 | 14 | 1 | 0 | 0 | 0 | 0 | 0 | 0 | 46 | 20 |
| 12 | 15 | 15 | 0 | 1 | 0 | 0 | 0 | 0 | 1 | 47 | 15 |
| 13 | 16 | 16 | 0 | 0 | 1 | 0 | 0 | 0 | 0 | 48 | 5 |
| 14 | 17 | 17 | 0 | 0 | 0 | 1 | 0 | 0 | 0 | 49 | 1 |
| 15 | 18 | 18 | 0 | 0 | 0 | 1 | 0 | 1 | 0 | 50 | 255 |
| 15A | 19 | 19 | 0 | 0 | 0 | 1 | 0 | 0 | 0 | 51 | 245 |
| 16 | 20 | 20 | 0 | 0 | 0 | 1 | 0 | 0 | 1 | 52 | 99 |
| 17 | 21 | 21 | 1 | 0 | 0 | 0 | 0 | 0 | 0 | 53 | 30 |
| 18 | 22 | 22 | 0 | 1 | 0 | 0 | 0 | 0 | 1 | 54 | 15 |
| 19 | 23 | 23 | 0 | 0 | 1 | 0 | 0 | 0 | 0 | 55 | 3 |
| 20 | 24 | 24 | 0 | 0 | 0 | 1 | 0 | 0 | 1 | 56 | 1 |
| 21 | 25 | 25 | 0 | 0 | 0 | 1 | 0 | 1 | 0 | 57 | 255 |
| 21A | 26 | 26 | 0 | 0 | 0 | 1 | 0 | 0 | 0 | 58 | 245 |
| 22 | 27 | 27 | 0 | 0 | 0 | 1 | 0 | 1 | 0 | 59 | 99 |
| 23 | 28 | 28 | 1 | 0 | 0 | 0 | 0 | 0 | 0 | 60 | 10 |
| 24 | 29 | 29 | 0 | 1 | 0 | 0 | 0 | 0 | 0 | 61 | 15 |

TABLE I-continued

| | | | Lower Memory Contents | | | | Input Field | | Upper Memory Contents | |
| | | | Logic State Field | | | | | | | |
| Event Point | Node | Memory Address | M1 (Ready) | M2 (Pause) | M3 (Accept) | M4 (Dead) | M5 (Unlock) | M6 (Input 1) | M7 (Input 2) | Memory Address | Distance Field M1–M8 |
| --- | --- | --- | --- | --- | --- | --- | --- | --- | --- | --- | --- |
| 25 | 30 | 30 | 0 | 0 | 1 | 0 | 0 | 0 | 0 | 62 | 4 |
| 26 | 31 | 31 | 0 | 0 | 0 | 0 | 1 | 1 | 0 | 63 | 0 |

There has therefore been described an improved system for automatically performing extensive tests on a variety of sequential digital devices. The characteristics of the unit under test, as well as the specifics of the test sequence, are stored in a read-only memory. The system is therefore made a universal tester by the emplacement of a ROM appropriate to the device and test. The testing of devices with different input, logic state and distance fields requires virtually no changing of the operating system. This automatic testing scheme can therefore be considered to be a universal sequential digital logic system tester. Automatic, high speed testing is made possible by speeding up the system clock within the device. Trouble-shooting diagnosis may optionally be facilitated by including a read-out of the point of failure. The flexibility of this automatic testing system enhances its applicability to a wide range of digital systems and devices. Much of the electronic ordnance presently being developed falls into this category, and consideration should be given at the design stage to facilitating interface with such a tester. Because of the simplicity of the operating system and its digital nature, large-scale integration using C/MOS technology could create a small-volume, ultra-low power testing device. A self-test feature could then be incorporated within the system under consideration, greatly simplifying the problems of stock-pile withdrawal and periodic testing.

Obviously, many modifications and variations of the present invention are possible in light of the above teachings. If it is possible to drive the tested system with an external oscillator substantial savings of real time can result by accelerating the clocking rate. In some instances hours of testing can be compressed into seconds, greatly facilitating production testing. Results of a test can be as detailed as desired. Since the sequence is interrupted when a failure occurs, the time and nature of the problem can be displayed to an operator. Alternatively, a simple GO, NO-GO format could be implemented. It is therefore to be understood that within the scope of the appended claims the invention may be practiced otherwise than as specifically described.

What is claimed as new and desired to be secured by Letters Patent of the United States is:

1. An automatic testing device for digital sequential logic devices comprising:
   a read only memory programmed with a series of inputs and expected outputs;
   logic means for advancing said read only memory through various stages and
   a plurality of EXCLUSIVE-OR gates coupled to the outputs of said read only memory and said devices for comparing the output of said read only memory with the outputs of said devices under test;
   whereby any device whose output does not correspond to that of said read only memory output may be noted.

2. An automatic testing device as recited in claim 1 wherein said logic means comprises:
   an oscillator for providing clock pulses to various logical elements;
   a first, second and third counter and a first and second bistable multivibrator.

3. An automatic testing device as recited in claim 2 wherein at the beginning of a test, said oscillator clocks said first counter which causes said second counter to address a first data node of memory.

4. An automatic testing device as recited in claim 3 wherein said third counter is activated by said read only memory to count down to zero to produce an output signal which resets the logic means.

* * * * *